United States Patent [19]
Feldman

[11] 4,134,060
[45] Jan. 9, 1979

[54] BATTERY DETERIORATION MONITORING APPARATUS EMPLOYING VOLTAGE COMPARISON MEANS FOR ACTIVATION OF A BATTERY ALARM

[75] Inventor: Keiva Feldman, Ottawa, Canada

[73] Assignee: Her Majesty the Queen in right of Canada, as represented by the Minister of National Defence in Her Majesty's Canadian Government, Ottawa, Canada

[21] Appl. No.: 768,874

[22] Filed: Feb. 15, 1977

[30] Foreign Application Priority Data
Mar. 9, 1976 [CA] Canada .................................... 247454

[51] Int. Cl.² ............................................. G01N 27/42
[52] U.S. Cl. .................................................. 324/29.5
[58] Field of Search ........................ 324/29.5; 307/360

[56] References Cited
U.S. PATENT DOCUMENTS

| 2,904,748 | 9/1959 | Christie et al. | 324/29.5 |
| 3,599,094 | 8/1971 | Pring | 324/29.5 |

FOREIGN PATENT DOCUMENTS 236284 7/1925 United Kingdom ..................... 324/29.5

Primary Examiner—Robert J. Corcoran
Attorney, Agent, or Firm—Stevens, Davis, Miller & Mosher

[57] ABSTRACT

An apparatus for and method of monitoring a battery for faulty cells by comparing a pair of input voltages from respective groups of the cells to provide an output signal corresponding to a difference between the input voltages, which initiates an alarm signal when the voltage difference exceeds a predetermined value. To compensate for normal differences between the voltages, the relative magnitudes of the input voltages may be adjusted before the input voltages are compared.

3 Claims, 1 Drawing Figure

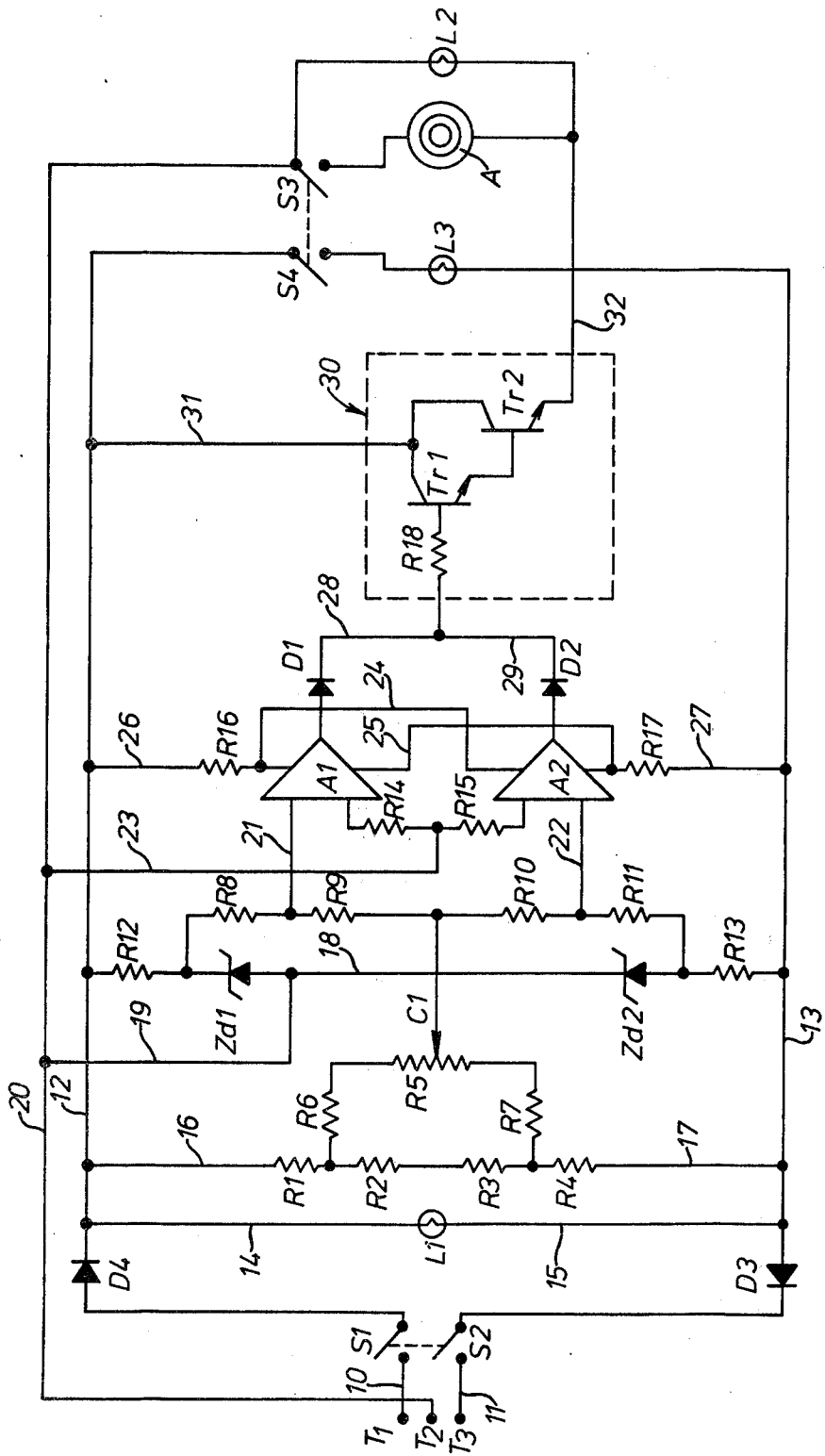

BATTERY DETERIORATION MONITORING APPARATUS EMPLOYING VOLTAGE COMPARISON MEANS FOR ACTIVATION OF A BATTERY ALARM

The present invention relates to apparatus for, and methods of, monitoring a battery to provide an early warning of failure of a cell of the battery.

The invention is particularly useful for monitoring deterioration of nickel/cadmium batteries.

It has been found that batteries fail by initially developing an internal short circuit in a single cell, or by a single cell or a small group of cells heating up more than the rest due to deteriorated barrier material.

More particularly, it is theoretically possible under certain conditions for an undeteriorated nickel/cadmium battery to heat up as a result of the charging current and hence to draw increased charging current. In this way, a positive feedback cycle is set up and "thermal runaway" occurs.

It is possible for the above process to occur much more rapidly as a result of a deteriorated barrier material which fails to stop oxygen generated at the positive plate from reaching the negative plate.

More particularly, cell failure may be initiated when a conductive bridge between the positive and negative plates of a cell is produced by failure of a portion of the three layer separators between the plates. These separators comprise two layers of nylon cloth with a layer of cellophane interposed therebetween. If the cellophane is not intact, then during overcharge, when gas is generated, oxygen from the positive plate can pass through the "non-intact" area to the negative plate, where it reacts and produces heat.

While such failure could occur simultaneously in all cells of a battery if all of the barriers are deteriorated, it is unlikely that they would all be equally deteriorated.

It is also possible for individual cells to heat up as a result of oxygen getting to the negative plate by passing around the barrier, the bottoms of which are normally open, even if the barrier itself is not deteriorated. The quantity of oxygen doing so would be less in this case than in the case of a deteriorated barrier material, and the resulting temperature rise would therefore be slower. Again it is unlikely that all of the cells would behave in a precisely identical way.

It is possible for an individual cell to develop an internal short circuit, either as a result of the puncture of the separator materials by sharp projections, or as a result of the slow collection of migrating metal between the plates in an area where the barrier material does not intercept the path. The latter may be due to improper assembly or to deterioration of the barrier material. In both of these cases it is likely that the short circuit development will start slowly, i.e. start as a high resistance path. The resistance falls as the path develops and this probably occurs mostly while the battery is being charged. When the resistance is low enough, the area heats rapidly as a result of a large current through the path. The current may in part be the charging current, but can become much greater as a result of the self discharge of the cell. When the self-discharge has proceeded sufficiently, the back-voltage of the cell, and hence the battery total, falls and this may cause the charge current to increase and thus to amplify the above-described processes of deterioration.

Hitherto, early detection of such battery failures has required repeated measurement of the voltages of all of the cells of the battery, and evaluation of the measurements. Such evaluation is complex since, during the normal course of events, the voltage of any given cell in the battery may vary by more than one thousand millivolts. Within this variation, it is necessary to detect an atypical variation of approximately 50 to 80 millivolts. To enable such method to provide a timely indication of failure of a cell, before the thermal runaway condition occurs, it would be necessary to provide a complex arrangement of leads to the battery cells and a complex detection apparatus, for example a computer.

It is accordingly an object of the present invention to provide an improved apparatus for, and a method of, facilitating the monitoring of a battery to enable such cell failure to be detected, and the enable a corresponding alarm to be initiated.

According to the present invention, there is provided apparatus for monitoring a battery, comprising voltage comparison means for comparing a pair of input voltages and providing an output signal corresponding to the difference between the input voltages, means responsive to the output signal for providing an alarm signal when the difference exceeds a predetermined value, and means for connecting the voltage comparison means to different groups of cells of the battery, whereby each of the groups provides a respective one of the input voltages.

If the battery consists of an even number of cells, then the apparatus is preferably connected so that one of the input voltages is the voltage developed over one half of the cells, and the other input voltage is that developed across the other half of the cells.

However, to compensate for normal differences between the input voltages, for example when the battery consists of an uneven number of cells and it is necessary to compare voltage across a group of cells with that across another group of cells containing a like number plus one of the cells, means may be provided for adjusting the relative magnitudes of the input voltages. Such means may, for example, comprise a bridge circuit including a rheostat.

Preferably, the voltage comparison means is such that no output signal is produced thereby until the difference between the input voltages exceeds the above-mentioned predetermined value, which is sufficiently low, (e.g. 30 millivolts,) to provide a sufficiently early warning of battery deterioration, but which is sufficiently high to avoid false alarms in response to normal voltage variations due e.g. to differential temperature variations. For this purpose, for example, the voltage comparison means may comprise a pair of suitably interconnected operational amplifiers responsive to respective ones of the input voltages.

The present invention further provides a method of monitoring a battery, comprising the steps of comparing the voltages of respective groups of cells of the battery to provide an output signal, and using the output signal to initiate an alarm warning of the fault when the difference between the voltages exceeds a predetermined value corresponding to a faulty cell in the battery.

The invention will be more readily understood from the following description of a preferred embodiment thereof with reference to the accompanying drawing, which illustrates a circuit diagram of a battery monitoring apparatus.

The circuit illustrated in the drawing has three input terminals T1, T2 and T3.

The input terminals T1 and T3 are connected by respective conductors 10 and 11 to linked switches S1 and S2, which in turn are connected to conductors 12 and 13.

An indicator lamp L1 connected across conductors 12 and 13 by conductors 14 and 15 serves to provide a visual indication of the closure of the switches S1 and S2 which, operating simultaneously, form the main or power switch of the apparatus.

Resistors R1 to R4 are connected in series across the conductors 12 and 13 by conductors 16 and 17, and a rheostat R5 is connected, through resistors R6 and R7, between the resistors R1, R2 and R3, R4, respectively.

The rheostat R5 has an adjustable contact arm C1 connected between resistor pairs R8, R9 and R10, R11, which are in turn connected through resistors R12 and R13 to the conductors 12 and 13.

Zener diodes Zd1 and Zd2 are connected in series across the resistors R12 and R13 by conductor 18, which is connected, between Zener diodes Zd1 and Zd2, by conductor 19 to a conductor 20 extending from terminal T2.

The resistors and rheostat R1 to R13 form a balance or bridge circuit by which, by adjustment of the rheostate R5, a voltage is provided between the input voltage of terminals T1 and T3 which is precisely equal to the voltage of terminal T2 to thereby compensate for unequal numbers of cells, and for normal variations in cell voltages.

A pair of operational amplifiers A1 and A2 are connected by conductors 21 and 22, respectively, between resistors R8, R9 and R10, R11.

The operational amplifiers A1 and A2 are connected through respective resistors R14 and R15 and a conductor 23 to the conductor 20, and are also interconnected by conductors 24 and 25 and connected through resistors R16 and R17 and conductors 26 and 27 to the conductors 12 and 13.

In the present embodiment, the operational amplifiers A1 and A2 are those sold by Texas Instruments Inc. under Model No. 7274IN, although any suitable equivalents could be substituted therefore, and the voltage applied to the operational amplifier A2 is inverted relative to that applied to the operational amplifier A1 to provide for operation when the voltage at contact C1 shifts in either direction, i.e. a response is obtained for signals of either polarity.

The outputs of the operational amplifiers A1 and A2 are connected, through diodes D1 and D2 and conductors 28 and 29, to a pair of transistors Tr1 and Tr2, which are interconnected to form a Darlington pair indicated generally by reference numeral 30.

The Darlington pair 30 is connected across conductors 12 and 20 through a visual warning lamp L2 by conductors 31 and 32.

An audio alarm device A can be connected in parallel with the visual alarm lamp L2 by closure of a switch S3.

A switch S4, interconnected for simultaneous actuation with the switch S3, is connected in series with an indicator lamp L3 across the conductors 12 and 13.

The operation of the above-described apparatus is as follows.

When it is desired to connect the apparatus to a battery for monitoring the battery, the terminals T1 and T3 are connected to the positive and negative terminals, respectively, of the battery. The terminal T2 is connected between two cells in the electrical center of the battery such that the terminals T1 and T2 are connected across half of the cells, whereas the terminals T2 and T3 are connected across the other half of the cells, assuming that the battery has an even number of cells.

The main switch S1, S2 is then closed, and the rheostat R5 is adjusted so that the voltages applied to the operational amplifiers A1 and A2 are balanced in order to compensate for any normal variations in the cell voltages. In the case of a battery having an uneven number of cells, when, for example, the terminals T1 and T2 are connected across one less cell than the terminals T2 and T3, the rheostat can be used to balance the resulting unequal input voltages across the terminals.

With the voltage applied to the operational amplifiers A1 and A2 thus balanced, the outputs of the operational amplifiers A1 and A2 are low so that the Darlington pair 30 is cutoff.

However, if at some time after the balance control C1 has been set, the battery has a faulty cell and consequently there is an imbalance, exceeding a predetermined threshold value, in the voltages applied to the operational amplifiers A1 and A2, then one of the operational amplifiers A1 and A2 functions to provide an output signal on the corresponding conductor 28 or 29 to the Darlington pair 30, which in turn is operated to energize the lamp L2. The lamp L2 is therefore illuminated, to give a visual warning of the cell failure.

The diodes D1 and D2 buffer the outputs of the operational amplifiers A1 and A2 together, so that a positive output on either one turns on the Darlington pair 30.

If the switches S3 and S4 are closed, then the audio alarm device A is also energized to provide an audible alarm signal.

The purpose of the lamp L3 is to indicate whether the audio alarm device A has been rendered operative by closure of the switch S3.

The Zener diodes Zd1, Zd2 operate as follows: Current from the conductor 19 flows through the Zener diode Zd1 and the resistor R12 to the conductor 12 (and similarly from the conductor 13 through the Zener diode Zd2 and the resistor R13 to the conductor 19). This provides a fixed positive voltage at the junction of the Zener diode Zd1 and resistor R8, and equal but negative voltage at the Zener diode Zd2 and the resistor R11, both regardless of variations at terminals T1, T3. These act as stable points against which variations at C1 can be manipulated. The ratios between the resistances of the resistors R8, R9, and R11 and R10 determine the fraction of the voltage variation at the contact C1 which is applied to the operational amplifiers A1 and A2 and hence, in part, the sensitivity of the circuit.

The resistors R1 and R7 inclusive provide a suitable network between the terminals T1 and T3 to both give a means of finding an initial balance point between the two "halves" of the battery, and to give a suitable point at which to sense any subsequent unsymmetric variation. The resistors R5, R6 and R7 provide another sensitivity modification. The resistors R14, R15, R16, R17 and resistor R18 in series with the input to the Darlington pair are protective resistors.

A diode D3 in series with the switch S2 in the conductor 13 and a diode D4 in series with the switch S1 in the conductor 12 provide protection against damage if the connections T1, T3 to the battery are inadvertently reversed.

The embodiments of the invention in which an exclusive property or privilege is claimed are defined as follows:

1. Apparatus for continuously monitoring, a battery having a plurality of cells, a first terminal, a second terminal and an intermediate terminal connected between two of said plurality of cells, the voltage between said first and intermediate terminals providing a first input voltage across a first cell group and the voltage between said second and intermediate terminals providing a second input voltage across a second cell group, comprising:

first, second and third input terminals for coupling to said first, second and intermediate terminals of said battery, respectively;

first and second operational amplifiers each having first and second inputs, said second inputs being coupled to said third input terminal, a plurality of resistors including a tapped rheostat connected across said first and second terminals, the tap on said rheostat being coupled to the first inputs of said first and second operational amplifiers, said rheostat being adjusted when said battery is in good condition for minimum output from said operational amplifiers and to initially balance said first and second input voltages to compensate for normal differences in the voltages across said first and second cell groups, first and second zener diodes each having an electrode coupled to said third input terminal, a first resistor connected between the other electrode of said first zener diode and said first input terminal, a second resistor connected between the other electrode of said second zener diode and said second input terminal, means coupling the junction of said first resistor and said first zener diode to the first input of said first operational amplifier, and means coupling the junction of said second resistor and said second zener diode to the first input of said second operational amplifier, alarm means, and amplifier means coupling said alarm means to the outputs of said operational amplifiers, an imbalance in the voltage applied to said operational amplifiers which exceeds a predetermined threshold value causing one of said operational amplifiers to conduct thereby energizing said alarm means.

2. Apparatus as claimed in claim 1, wherein said alarm means comprise an alarm device, switch means which are closable for connecting said alarm device in circuit with said amplifier means to thereby render said alarm device operative, and indicator means controlled by said switch means for indicating closure of said switch means.

3. Apparatus as defined by claim 1, wherein said amplifier means is a Darlington pair.

* * * * *